United States Patent [19]

Wiernicki

[11] Patent Number: 4,561,819

[45] Date of Patent: Dec. 31, 1985

[54] FLAT ARTICLE CONVEYOR

[75] Inventor: Michael V. Wiernicki, Trumansburg, N.Y.

[73] Assignee: Ironica, Inc., Ithica, N.Y.

[21] Appl. No.: 580,241

[22] Filed: Feb. 15, 1984

[51] Int. Cl.⁴ .............................................. B65G 39/10
[52] U.S. Cl. .................................... 414/331; 198/345; 198/624
[58] Field of Search ................ 414/331, 416; 198/345, 198/624, 648

[56] References Cited

U.S. PATENT DOCUMENTS

| 746,145 | 12/1903 | Perky | 198/624 |
| 3,931,882 | 1/1976 | Ossbahr | 198/648 |
| 4,367,915 | 1/1983 | Georges | 414/331 X |
| 4,377,434 | 3/1983 | DelBianco | 198/624 X |

FOREIGN PATENT DOCUMENTS 186370 10/1966 U.S.S.R. ............................... 198/624

Primary Examiner—Robert G. Sheridan
Attorney, Agent, or Firm—Larson and Taylor

[57] ABSTRACT

A roller drive conveyor for conveying a rectangular, planar rigid article is disclosed. The conveyor includes two opposed, spaced apart rows of individually mounted wheels having a bottom flange, the upper surface of which provides the only constantly conveying contact. In a specific embodiment, a magazine for storing a stack of the articles and an extractor in operative relationship with the conveyor for extracting the objects from the magazine and feeding them to the conveyor are disclosed. In other specific embodiments, the conveyor includes a test station with a stop pin and locating pins for accurately positioning the conveyed article.

25 Claims, 12 Drawing Figures

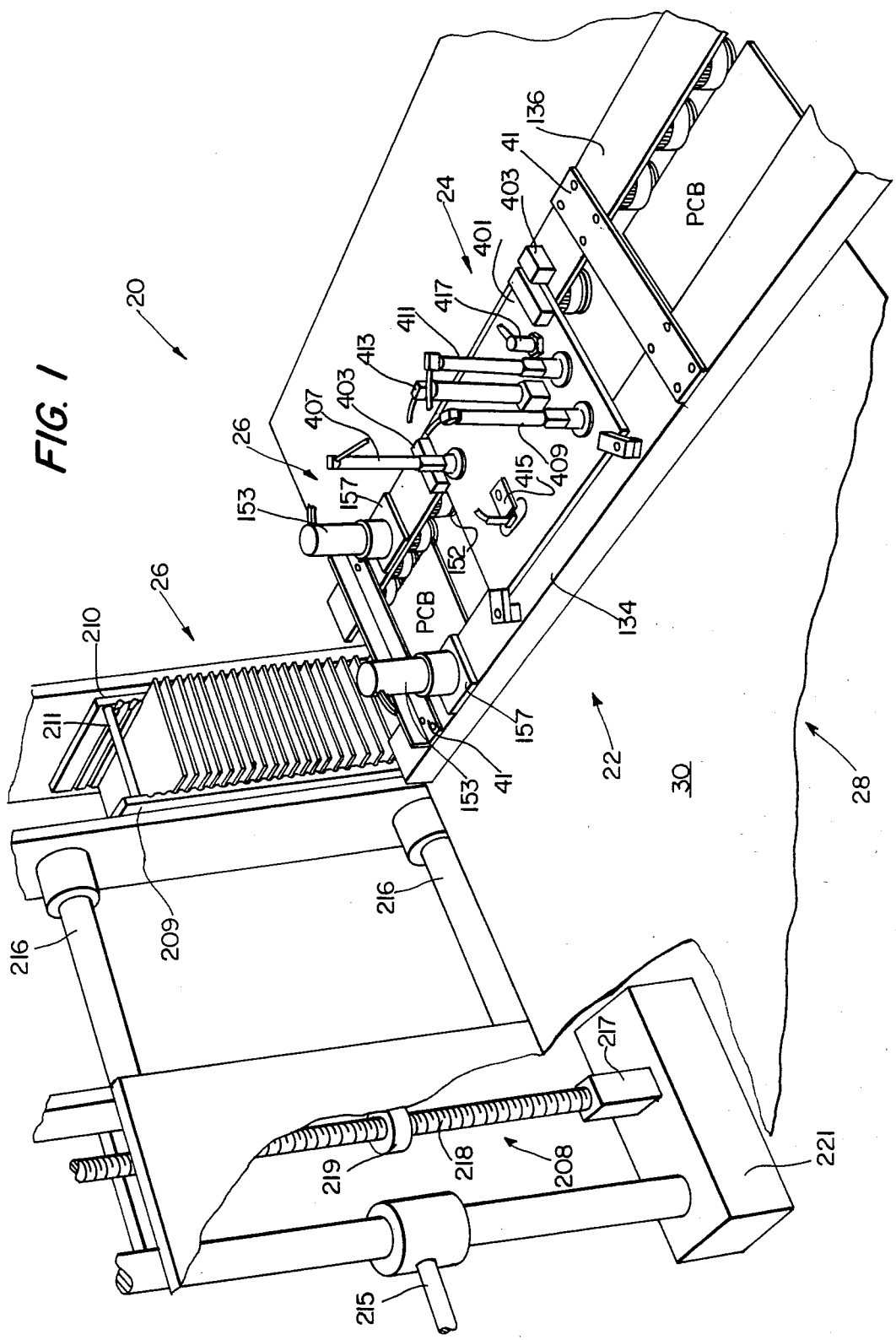

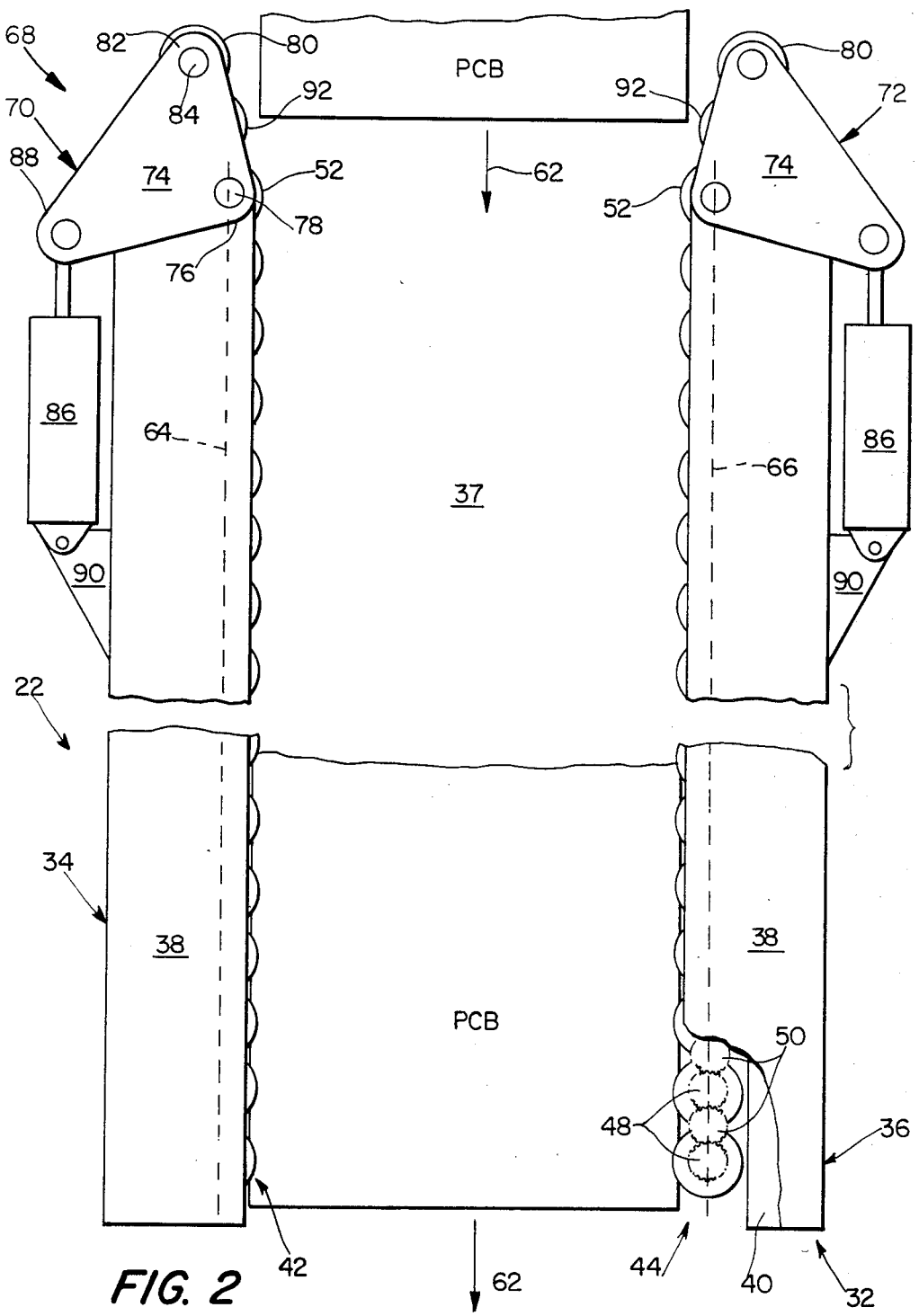
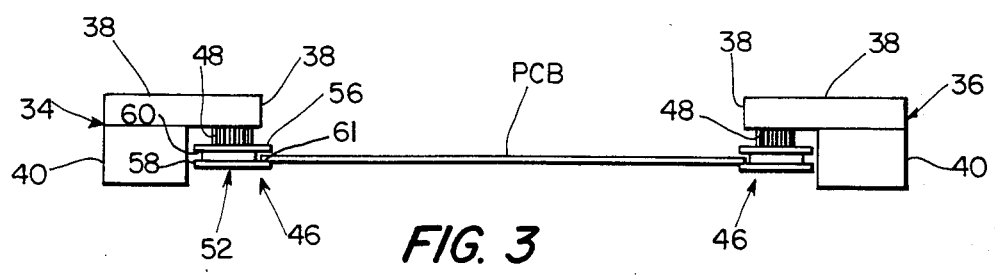

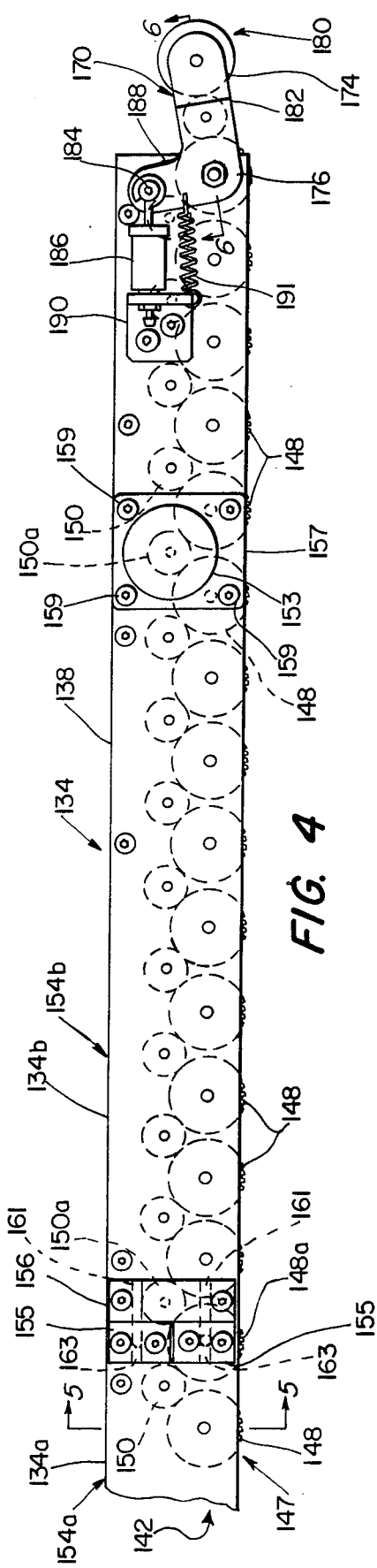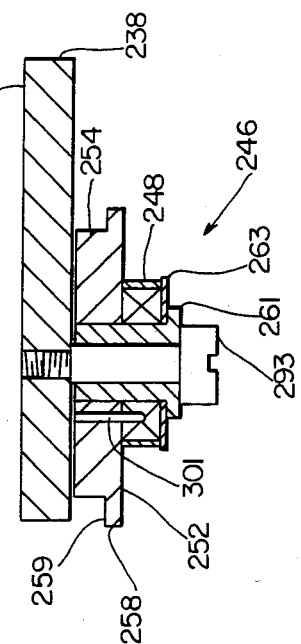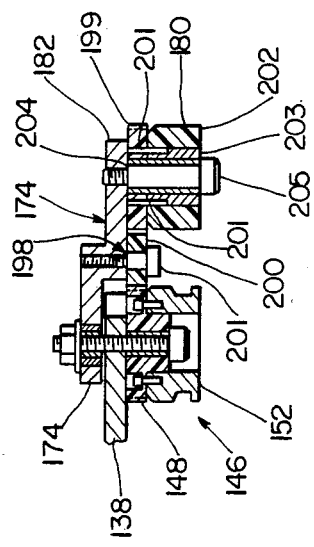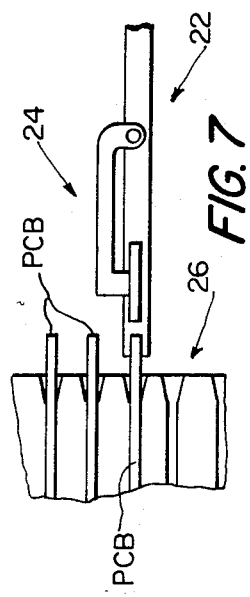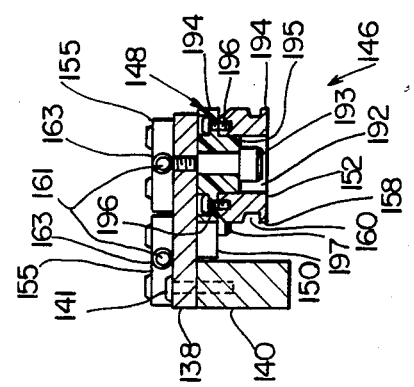

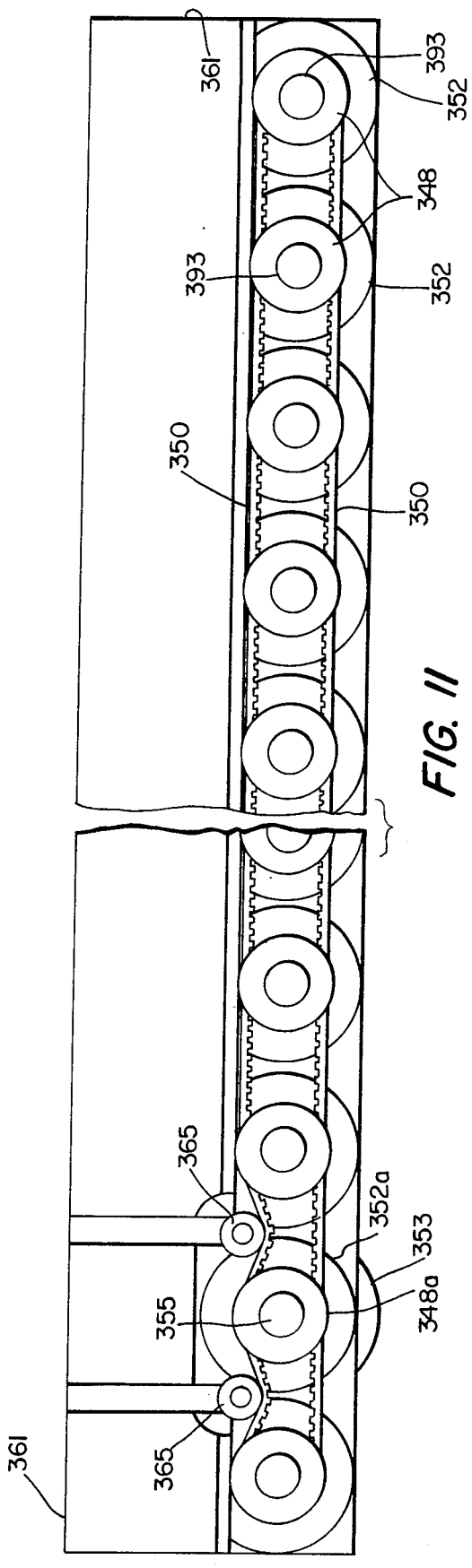
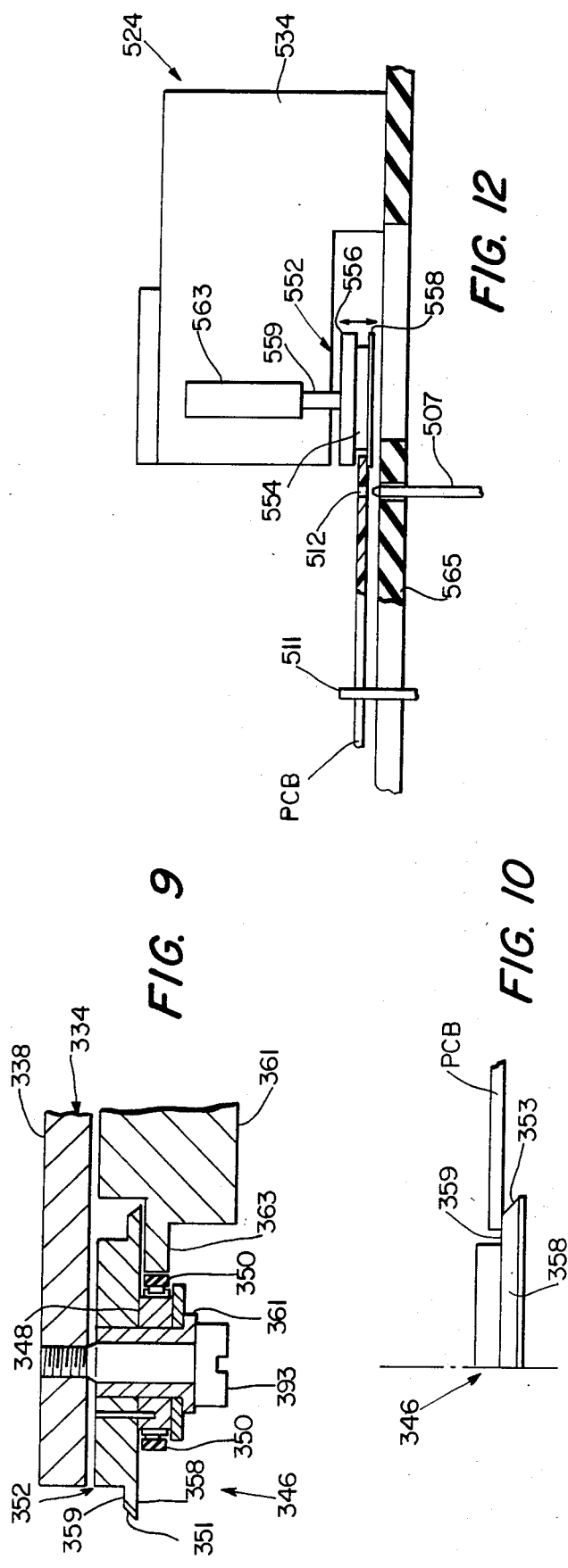
FIG. 11
FIG. 9
FIG. 10
FIG. 12

FLAT ARTICLE CONVEYOR

FIELD OF THE INVENTION

The present invention relate to conveying apparatus, and in particular relates to a roller drive conveyor for conveying flat articles, such as printed circuit boards.

BACKGROUND OF THE INVENTION

In most manufacturing processes, it is necessary to convey an article from one station where one part of the process is performed to another station where another part of the process is performed. The ability to convey the articles automatically and in a timed sequence can often mean the savings of large sums of money and large amounts of time. Furthermore, it is often necessary not only to convey an article from one station to a second station, but also to accurately position the article at the second station. There is also the need to perform operations on articles at one station along the conveyor and then, with minimal delay or article repositioning, to convey the article to a further station with the same conveyor.

The above listed objectives are also desirable in the handling of printed circuit boards. Ideally, printed circuit boards have an overall rectangular shape, have a relatively thin cross sectional thickness, and are flat. However, in reality circuit boards are often warped and are not manufactured to precise tolerances in any of the three dimensions. Therefore, any conveying system must accomodate these realities.

Prior art conveyors for conveying printed circuit boards have included belt conveyors, pushing or pulling devices, chain conveyors and vibration conveyors. Belt conveyors have the disadvantage of not permitting work to be done on the underside of the conveyed board. Furthermore, belt conveyors take up greater space since provision has to be made for the belt return. It is also difficult to get clinch heads in their proper alignment. In one type of belt conveyor, two relatively thin belts are used to engage the boards on each side. However, it is difficult to keep the boards aligned and misalignment and jamming often occurr. Jamming particularly occurrs when alignment guides are used on either side of the belts. Link chain conveyors which carried the boards on projections have difficulties with bearings and pins wearing out and in addition tend to create an oily environment resulting in oil getting on the cards. Pushing and pulling devices also suffer from the inability to locate the cards accurately and further have the disadvantages of being expensive and prone to breaking down. In one known type of vibrator convoyor, a large number of upstanding, vibrated bristles are used to convey the board. This type of conveyor not only has the disadvantages of larger space requirements and the inability to allow work to be done on the underside of the card, but also tends to build up static electricity on the board.

Conveying a flat pan or circuit board with a rotary member such as a roller drive is known in the prior art. Such devices are disclosed in the Del Bianco et al U.S. Pat. Nos. 4,377,434 and Perkey U.S. Pat. No. 746,145, and a Russian Patent No. 186,370. In particular, the Del Bianco et al patent discloses a V-shaped roller drive that includes an array of opposed roller elements 92, each element having a slot and a driving surface disposed at the base of the slot. Thus, this patent discloses the coveyance of a circuit board through the physical engagement of the edge of the board with a driving surface at the base of the roller element slot. The Perky patent discloses a roller type conveyor for conveying pans wherein the top and bottom flanges of the rollers engage the top and bottom surface edges of the pan. A spring forces the two flanges against the pan to ensure positive drive. The Russian patent discloses a conveying system for film material in which opposed rollers with V-grooves are spaced apart a distance that is less than the width of the film. Thus, the film is bowed when engaged by the opposed rollers. Consequently, in each of these patent references, the conveyance of the article requires a forced contact between the opposed rollers and the article to be conveyed.

The disadvantages of the roller conveyors disclosed in the aforementioned patents include possible jamming by warped or oversized articles, a positive drive that can defeat positioning of the conveyed article, and wearing on the conveyed article and the conveyor rollers.

SUMMARY OF THE INVENTION

The present invention overcomes these and other problems in the prior art by providing a conveyor that is not sensitive to large tolerances or warped articles being conveyed, such as circuit boards, that still efficiently and effectively conveys the boards without jamming or damaging the conveyed boards, and which provides maximum underboard clearance. Furthermore, the present invention provides a conveyer in which working stations can be provided both above and below the board and the conveyor itself occupies very little space.

According to the present invention, the conveyor comprises a first set of a plurality of rotatable wheels that are aligned along a first longitudinal axis and a second set of a plurality of rotatable wheels that are aligned along a second longitudinal axis that is essentially parallel to the first longitudinal axis. Each of the wheels has a conveying surface for supporting the conveyed object or article and all of the wheels are mounted such that all of the conveying surfaces esentially lie in a substantially horizontal plane. The conveying surfaces are the only portions of the conveyor in constant conveying contact with an object or article being conveyed.

In a specific embodiment of the present invention, the conveyor also includes a magazine for storing the objects to be conveyed and an extracting means for extracting the objects from the magazine and feeding them individually to the conveyor wheels. In another specific embodiment of the present invention, the conveyor wheel is comprised of only one flange so that the conveyed article can be vertically removed from the conveyor wheels.

These and other objectives, advantages and features of the present invention will be described in or be apparent from a detailed description of the presently preferred embodiments of the invention set forth hereinbelow.

BRIEF DESCRIPTION OF THE DRAWINGS

FIG. 1 is a perspective view of one embodiment of a conveyor according to the present invention which includes a magazine for storing the articles to be conveyed;

FIG. 2 is a top plan diagrammatic view with parts removed, of a conveyor which illustrates the present invention;

FIG. 3 is an end elevational view of the conveyor depicted in FIG. 2;

FIG. 4 is a scaled, top plan view of one side of part of the conveyor depicted in FIG. 1;

FIG. 5 is a cross-sectional view taken along lines 5—5 in FIG. 4;

FIG. 6 is a cross-sectional view taken along lines 6—6 in FIG. 4;

FIG. 7 is a schematic view of the magazine and a means for determining when the magazine is in a predetermined vertical position;

FIG. 8 is a cross-sectional view of a mounted conveyor wheel according to a second embodiment of the invention;

FIG. 9 is a cross-sectional view of a conveyor wheel and drive means according to yet another embodiment of the present invention;

FIG. 10 is an enlarged side elevational view of the conveyor wheel depicted in FIG. 9;

FIG. 11 is a bottom plan view of part of the conveyor using the drive means depicted in FIG. 9; and FIG. 12 is a side elevational view, partly in cross section, of a work station utilizing a conveyor wheel of yet another embodiment of the present invention.

DETAILED DESCRIPTION OF THE PREFERRED EMBODIMENTS

The present invention will now be described with respect to specific embodiments thereof as depicted in the drawings in which like elements are depicted by like numerals throughout the several views. Where possible, similar features of different embodiments will be depicted by numerals that have the same units and tens digits, but a different hundreds digit.

With particular reference to FIG. 1, a conveyor 20 is depicted for conveying printed circuit boards, denoted PCB. Conveyor 20 includes a conveyor section 22 having a work station 24 at one end and a magazine 26 located at the other end. Conveyor section 22 is mounted on a table 28 having a horizontal top 30.

The theory of operation of conveyor section 22 will be described with reference to the diagrammatic drawings of FIGS. 2 and 3. Conveyor section 22 includes a frame 32 that is comprised of a first elongate rail 34 and a second elongate rail 36 spaced apart from and parallel to first rail 34. Rails 34 and 36 have an L-shaped cross section and are comprised of an upper, elongate top bar 38 and a rigidly attached, elongate support bar 40. As shown in FIG. 1, rails 34 and 36 are rigidly connected together by forward and rearward transverse braces 41 having a length selected such that the desired transverse spacing can be obtained. The spacing is determined by the width of the board to be conveyed. Although braces 41 are depicted as being fixed in length, in alternative embodiments they can be manually adjustable or automatically adjustable (e.g. by using a computer controlled motor to change the lengths). In other configurations, the effective conveying width of conveyor section 22 can be fixed by rigidly mounting rails 34 and 36 to a supporting structure, such as table 28.

Respectively mounted to the underside of rails 34 and 36 are a first and second second set, 42 and 44 of a plurality of transport wheel assemblies 46. Each wheel assembly set 42 or 44 also includes a means for reversibly, simultaneously rotating the wheel assemblies in the same direction at the same angular velocity. The wheel assemblies of set 42 are rotated in one direction and the wheel asemblies of set 44 are rotated in the opposite direction. In the schematic embodiment of the invention depicted in FIG. 2, the rotating means includes a gear train and a motor (not depicted in FIG. 2). The gear train is comprised of a plurality of drive gears 48, each gear 48 being individual to each transport wheel assembly 46 and a plurality of idler gears 50, each idler gear 50 being in meshing relationship with adjacent drive gears 48. Although not required, corresponding wheel assemblies of sets 42 and 44 are preferably located transversely opposite each other.

Although transport wheel assembly 46 is described in greater detail hereinbelow with respect to specific embodiments thereof, for the purposes of describing the principles of operation, it will be described with respect to the embodiment depicted in FIG. 3. Transport wheel assembly 46 as depicted in FIG. 3 is comprised of a transport wheel 52 rotatably mounted by means not shown to the underside of bar 38. Wheel 52 is rigidly mounted to and is driven by said corresponding drive gear 48. Wheel 52 is comprised of a central hub 54, and integral upper or top flange 56 and integral lower or bottom flange 58. The lower surface of top flange 56, the peripheral surface of hub 54 and the upper surface of bottom flange 58 define a slot 60. The portion of the upper surface of bottom flange 58 that supports board PCB (i.e. the transverse inner peripheral portion of the upper surface of bottom flange 58) is termed the "conveying surface" and is denoted numeral 61.

As shown in FIG. 3, a printed circuit board (PCB) extends between the two wheels assemblies 46 of first and second sets 42 and 44. More particularly, the two opposed side edges of board printed circuit are received inside slot 60, and conveying surface 61 is the only continuous support of and contact with board PCB, with this supporting contact only being along the board's bottom side edge portion. Stated another way, the peripheral sidewalls of the opposed hubs 54 are spaced apart a transverse distance that is greater that the width of board PCB. Furthermore, the height of slot 60 is selected such that it is greater than the thickness of board PCB. In fact, as described below, in some embodiments of the present invention slot 60 has an infinite height since top flange 56 is omitted. While hub 54, which extends in an axial direction above bottom flange 58, does not continuously contact board PCB or provide a conveying surface, it does provide a rotating guide surface in the event that a conveyed board PCB should become skewed as it is being conveyed. The conveyed direction is depicted out of the paper in FIG. 3 and in the direction of arrows 62 in FIG. 2. The sole conveying surface provided by the present invention is the upper, peripheral surface of bottom flange 58, which surface extends horizontally and, for a vertically mounted wheel 52, also extends axially. While the rotational axis of wheel 52 is depicted as being vertical, it is also possible to have a tilted rotational axis and a beveled bottom flange to provide a horizontal conveying surface.

All of the wheels 52 of first and second wheel assembly sets 42 and 44 are rotatably mounted on individual axes that are aligned along respective first and second longitudinal axes, depicted respectively at 64 and 66. Longitudinal axes 64 and 66 are further aligned to be essentially parallel to each other. All of wheels 52 are also individually vertically mounted to their respective rails such that conveying surfaces 61 all essentially lie in the same horizontal plane. In operation, frictional engagement between printed circuit board PCB and conveying surfaces 61 provide the rectilinear conveyance of printed circuit board PCB. This frictional engagement has been found to provide a constant, low slip conveyance of board PCB on the one hand, while still permitting the stopping of the conveyance by the simple insertion of a blocking pin in the path of board PCB. However, the rotation of wheels 52 does not have to be stopped when the conveyance of board PCB is stopped because there is no gripping engagement of board PCB by the conveying surface of wheels 52. By inserting a rigid abutment in the path of the conveyed board PCB, board PCB can be more accurately positioned than by timing the deenergization of the conveyor drive means.

Located at the forward end of conveyor section 22 (which is the right hand side of FIG. 2) is a printed circuit board extractor 68 for extracting the board PCB from magazine 26 (FIG. 1) and for feeding the extracted board PCB to transport wheel assemblies 46. Extractor 68 is comprised of first and second extractor arms 70 and 72 respectively mounted on the ends of first and second rails 34 and 36. Extractor arms 70 and 72 each are comprised of a gusset lever plate 74 pivotally mounted at the central corner 76 with a pivot pin 78. An extractor roller 80 is rotatably mounted to the forward corner 82 of lever 74 with a pivot pin 84. Roller 80 preferably has a smooth metal surface and can be made from anodized aluminum, for example. While roller 80 could have a rubber surface or a knurled metal surface, neither has been found to be needed. In addition, it has been found that a rubber peripheral surface wore excessively and the knurled surface did not provide any advantages over a plain metal surface. Roller 80 is driven by a gear train which, in turn, is driven by the corresponding gear train of wheel assembly first and second sets 42 and 44.

Lever 74 is pivoted by a fluid actuator 86 connected to the rearward corner 88 thereof. Actuator 86 is pivotally mounted at one end to a mounting plate 90, which in turn is rigidly mounted to the corresponding first or second rail 34 or 36. In some embodiments, an intermediate transport wheel 92 is rotationally mounted to lever 74 between roller 80 and the forwardmost wheel 52 of the corresponding first and second sets 42 and 44.

Upon the simultaneous actuation of the fluid actuators 86 of extractor arms 70 and 72, lever 74 is pivoted in a direction such that the corresponding roller 80 moves into engagement with the forwardmost, side edges of a board PCB stored in a horizontal orientation in magazine 26 (see FIG. 1). The mere frictional engagement of the two rollers 80 with the edges of board PCB is sufficient to withdraw board PCB from the magazine and feed it to intermediate transport wheels 92. After the board PCB has been extracted, fluid actuator 86 can be reversed to pivot the two levers 74 in the opposite directions. Magazine 26 is then free to index to provide another board PCB in the proper horizontal plane.

Conveyor section 22 will now be described in greater detail with respect to a first specific embodiment thereof as depicted in FIGS. 1, 4, 5 and 6. FIG. 4 depicts only a first rail 134, but it should be appreciated that the second rail 134 is simply the mirror image of first rail 134. First rail 134 is comprised of a horizontally mounted top bar 138. Mounted to the underside of top bar 138 are a first set 142 of a plurality of transport wheel assemblies 146 and an associated drive train 147 for rotatably driving wheel assemblies 46 in either the clockwise or the counterclockwise directions to effect a forward or a rearward rectilinear conveyance of the circuit board PCB. Drive train 147 is comprised of a plurality of drive gears 148 interconnected in a driving relationship with a plurality of idler gears 150 in meshing engagement between adjacent drive gears 148. A 24 volt DC electric motor 153 (e.g. of the conventional type manufactured by Pitman) provided with a gear head output drive (with an exemplary drive ratio of 6.3:1) drives a corresponding idler gear 150a. Motor 153 is mounted onto a mounting plate 157, which in turn is rigidly mounted onto top bar 138 with screws 159. Motor 153 can be mounted to drive any one of the idler gears or the drive gears. However, if motor 153 is mounted on an idler gear, that would permit vertical movement of the drive gear, such as used at a test station described below with respect to FIG. 11. In addition, because friction imposes a practical limit to the operable length from the drive means of a gear train drive system (which for the present system is about 35 stages when sleeve bearings are used), it may be desirable to mount motor 153 in the center of the drive chain 147. In such a case, the practical limit is double (i.e., about 70 stages) the limit if motor 153 is mounted to drive the gear train at either end thereof.

One advantage of a gear train drive system is that conveyor section 22 can be easily built from a number of smaller sections. In FIG. 4, two such sections are depicted, a first section 154a and a second section 154b. Rail 134 is thus divided into two units, a first unit 134a and a second unit 134b which are connected together by a connection assembly 154. Connection assembly 154 is comprised of two transversely aligned mounting plates 155 rigidly mounted to rail 134a with two bolts each and a single mounting plate 156 rigidly mounted to rail 134b with two bolts. Plate 156 is provided with two pins 161 mounted therein and extending longitudinally therefrom. Pins 161 are received by two longitudinally extending bores 163 in plates 155. Thus section 154a can be easily connected or detached from section 154b simply by inserting or removing pins 161 in bores 163. An idler gear 150a attached to rail 134b easily meshes with drive gear 148a attached to rail 134a. Alternatively, rails 134a can be more permanently connected to rail 134b by using a single plate connected to both rails.

Mounted at the forward end of first rail 134 is a first extractor arm 170, which forms one half of an extractor 168. Extractor arm 170 is essentially a bell crank lever 174 pivotally mounted at the vertex 176 to top bar 138 with a pivot pin 178. Lever 174 is comprised of a leg 182 and an integral base 188. Rotatably mounted to the distal end of leg 182 is an extractor roller assembly 180. Mounted to the distal end of base 188 is an upstanding post 184 to which is connected the piston arm of a pneumatic actuator 186. The cylinder of actuator 186 is rigidly mounted to a mounting bracket 190, which in turn is rigidly mounted with screws to top bar 138. Lever 174 is returned to the extracted position by a return spring 191 which is mounted between lever base 188 and mounting bracket 190.

With particular reference now to FIG. 5, transport wheel assembly 146 according to a first embodiment is depicted in greater detail. Also depicted in FIG. 5 is top bar 138 of first rail 134 and an elongate vertical support bar 140 rigidly attached to top bar 138 with bolts 141. Wheel assembly 146 is comprised of a wheel 152 having a bore 192 therein and rotatably mounted to top bar 138 with a bolt 193 extending in bore 192. Wheel 152 is also provided with a thin flange 158 located the bottom periphery thereof, and an annular slot 160 located axially above flange 158. The uppermost part of wheel 152 is beveled inwardly so as to provide clearance for a drive gear 148 mounted between the bottom of top bar 138 and the top of wheel 152. Drive gear 148 has an upper peripheral, toothed flange section 194 and a downward depending, integral hub section 195 which extends into the top of wheel bore 192. Drive gear 148 is rigidly attached to wheel 152 with two screws 196. Idler gear 150 is also rotatably mounted to the bottom of top bar 138 with a bolt 197.

In an exemplary embodiment, wheel 152 is made from machined, anodized aluminum and has a nominal outer diameter of 1.1875 inches and a nominal height or axial length of 0.53 inches. Wheel bore 192 has nominal diameter of 0.625 inches and slot 160 has a nominal depth and height both of 0.125 inches. Drive gear 148 can be made of a plastic or nylon material and has a nominal diameter of 1.1875 inches. Drive gear 148 is provided with 36 teeth around the periphery of flange 194, providing a pitch of 32 and a 14½° P.A. Finally, in order to provide the maximum support for a conveyed circuit board PCB, wheel assemblies 146 are mounted 1.25 inches on center, thereby providing a peripheral separation between wheels 152 of only 0.0625 inches.

Extractor arm 170 is depicted in greater detail in FIG. 6. As can be seen in FIG. 6, lever 174 has a stepped cross-sectional configuration so that vertex 174 can be pivotally mounted to top bar 138 and a path can still be provided for an extractor drive train 198. As shown in FIG. 4, extractor drive train 198 is driven by the drive gear 148 of the last wheel assembly 146. Extractor drive train 198 is comprised of a roller drive gear 199 and an idler gear 200 in meshing engagement with roller drive gear 199 on one side and with wheel drive gear 148 on the other side. Idler gear 200 is rotatably mounted with a screw 201 to lever leg 182.

In this embodiment of the invention, roller 180 is comprised of an outer cylinder 202 made from urethane and mounted to an inner cylinder 203 made of aluminum. Screws 201 are inserted into bores in aluminum cylinder 203. Mounted inside inner cylinder 203 is a hollow sleeve 204 made of aluminum. Sleeve 204 extends beyond the upper ends of outer and inner cylinders 202 and 203 and into roller drive gear 199. A bolt 205 rotatably mounts roller 180 to lever leg 182. Roller 180 has an exemplary diameter and length equal to that of wheel 152. The upper end of roller 180 is also provided with a chamfer.

As mentioned above, the printed circuit boards PCB are stored in a vertical stack in magazine 26 such that each board is horizontally oriented. With reference to FIG. 1, magazine 26 is comprised of a magazine housing 206, a cantilever support 207 and a vertical drive mechanism 208. Magazine housing 206 is comprised of two spaced apart, slotted metal plates 209 and 210 rigidly connected in a spaced apart orientation by a plurality of transverse bars 211 (only one of which is depicted in FIG. 1). Support 207 is comprised of a stationary base 212, a stationary vertical pole 213, and a movable frame 214. Frame 214 is slidingly connected through an arm 215 to pole 213. Frame 214 further comprises two horizontally extending support bars 216 connected to magazine plate 209. Finally, magazine drive mechanism 208 is comprised of an electric motor 217, an elongate lead screw 218 rotatable by motor 217, and a travelling nut 219 on lead screw 218 and rigidly connected to magazine suppport frame 214.

A means for determining when a circuit board PCB stored in magazine 26 has been transported to the proper vertical position is diagrammatically depicted in FIG. 7. FIG. 7 shows three circuit boards PCB mounted in magazine 26 and two empty slots 221. A photoelectric sensing assembly 223 is pivotably mounted onto the forward end of conveyor section 22 and can be pivoted into position by a pneumatic actuator (not shown). When in position, sensing assembly 223 provides a signal when a circuit board PCB is aligned with the light beam emitted by sensing assembly 223.

When it is desired to provide the next printed circuit board in alignment with conveyor section 26, a signal is provided by a central control such as a programmed general purpose digital computer (not shown) to energize motor 217 in the proper direction. Motor 217 then rotates lead screw 218, and travelling nut 219 and movable frame 214 are moved vertically. At the same time that motor 217 is energized, sensing assembly 223 is positioned into place and the optical sensor is energized. When a printed circuit board interrupts the emitted beam, sensing assembly 223 provides a signal to the central controller which then deactivates motor 217, pivots sensing assembly 223 out of the way, and activates extractor 168 into the extracting position. If electric motors 153 have not been energized in the appropriate direction, the control system then energizes them, resulting in the rotation of the corresponding gear train, corresponding wheel assemblies and corresponding extractor rollers. When rollers 180, which are rotating in the appropriate board withdrawing direction, engage the vertically positioned printed circuit board PCB, they extract the board and feed it to the aligned wheels 152 of conveyor section 22. Alternatively, an empty magazine slot 221 can be positioned, conveyor motors 153 can be reversed, and conveyor section 22 can be used to reload magazine 26.

With reference now to FIG. 8, a second embodiment of a conveyor transport wheel assembly 246 is depicted. Wheel assembly 246 is rotatably mounted to the underside of the top bar 238 of a conveyor rail 234. Wheel assembly 246 comprises a wheel 252 that only has a bottom flange 258 and a radially extending, upstanding hub 254. Thus, the top flange 56 and slot 60 of wheel 52 depicted in FIG. 3 have been omitted. A peripheral conveying surface 259 is provided on one side of the top surface of flange 358. Exemplary dimensions of wheel 252 are a bottom nominal diameter of 1.05 inches and a nominal flange width of 0.09 inches. An exemplary flange thickness is 0.05 inches, which provides adequate clearance for the mounting of additional equipment below conveyor section 22.

In wheel assembly 246, a drive gear 248 is mounted below wheel 252 and rigidly attached thereto with two screws 301 (only of which is depicted). Both wheel 252 and gear 248 are coaxially mounted about a concentric mounting sleeve 261, which in turn is rotatably mounted to rail 234 with a bolt 293. A spacer or washer 263 is provided between mounting sleeve 261 and drive gear 248.

A further embodiment of a transport wheel assembly 346 is depicted in FIGS. 9 and 10. Wheel assembly 346 includes a wheel 352 that is similar to wheel 252 in FIG. 8 except that wheel 352 has a chamfered or beveled edge 351 between the periphery of wheel 352 and a horizontal conveying surface 359 on the upper side of wheel flange 358. Exemplary nominal dimensions of conveying surface 359 is a radial width of 0.02 to 0.03 inches, and a nominal thickness of flange 358 of from 0.01 inches to 0.062 inches. Beveled edge 353 has an exemplary angle of 45°. Beveled edge 353 helps to guide a warped leading edge of a printed circuit board PCB onto conveying surface 359.

Also depicted in FIGS. 9 and 11A is a second embodiment of a conveyor drive means. The conveyor drive means still is comprised of a drive gear 348 (which is identical to drive gear 248 in FIG. 8). However, the idler gears 200 depicted in FIGS. 4 and 5 has been replaced with a toothed drive belt 350 that is in peripheral engagement with all of the individual drive gears 348. A reversible, DC motor 353 is coaxially mounted on a shaft 355, that also has a wheel 352a and a gear drive 348a also mounted thereon. An elongate retainer bar 361 having a transversely extending flange 363 is mounted beneath top bar 338 of rail 334 so that flange 363 is closely spaced from, but not touching, the outward run of belt 350. Retainer bar 361 assures that belt 350 does not buckle and slip out of engagement with drive gears 348. Tension is maintained on belt 350 with two transversely adjustable tension wheels 365 engaging the outside surface of belt 350 on either side of motor 353. A bolt 393 secures a bearing sleeve 361 and the integrally mounted combination of wheel 352 and gear 348 to the underside of rail top bar 338 for all of the wheel assemblies except for the assembly to which motor 353 is connected. Alternative to having a toothed drive belt and drive gear, a flat or a round belt can be used to drive (e.g. with a serpentine connection) a smooth surfaced drive gear.

With reference again to FIG. 1, as mentioned above, work station 24 is depicted mounted above and below conveyor section 22. Work station 24 is for the purpose of applying a grinding tool (located below rails 134 and 136, but not shown in the drawings) to the circuit board PCB. That part of work station shown in FIG. 1 comprises a support plate 401 pivotably mounted to rail 136 with hinges 403. Mounted on support plate 401 near the forward edge 405 inside rail 136 is a pneumatically actuated forward tooling or shot pin assembly 407. A similar, rearward shot pin assembly 409 is mounted near the rearward edge, inside rail 134, of support plate 401. A pneumatically actuated stop pin assembly 411 is mounted to support plate 401 near the rearward edge thereof and aft of shot pin assembly 409, but centered between rails 134 and 136. Mounted slightly forward of stop pin assembly 411 on support plate 401 is a pneumatically actuated back up bar assembly 413. Extending through orifices in support plate 401 at opposite corners are two photoelectric sensing assemblies 415 and 417 for detecting the presence of a conveyed printed circuit board PCB and for detecting whether the board PCB is properly oriented.

The operation of work station 24 can be begun when an appropriate signal is sent by sensing assemblies 415 and 417 to the central control. Stop pin assembly 411 is actuated by a signal from the central control to an air valve in the assembly which admits pressurized air to force a pin (not shown) against spring pressure into the path of a board PCB being conveyed. When the board strikes the inserted pin, it slips on wheels 152 and its rearward progress is abated. The board is now positioned to within about 0.01 inches of its desired position and is held in this position by the action of conveyor wheels 152. Shot pin assemblies 407 and 409 each contain a dull pointed pin (not shown, but similar to pin 507, FIG. 12 infra) which can be inserted into corresponding orifices in the positioned board PCB when an appropriate signal is sent by the control to the assemblies. When inserted, the pins more accurately position board PCB and retain it in that position. The board PCB orifice can have a larger diameter than the pin thereby permitting vertical movement, or as presently preferred in most application, can be smaller so that the board can initially be moved slightly to attain the desired orientation and then clamped in place by forcing the board PCB against the lower wheel flange. Backup bar assembly 413 is now actuated by a signal from the central control to its air valve and a bar (not shown) is forced into abutment with the top rearward end of the positioned board PCB, forcing the board into securing contact with a bottom frame (not shown). The grinding tool can now be actuated and the appropriate tooling to the secured board PCB can be accomplished.

When the tooling of the board has been finished, the air pressure to assemblies 407, 409, 411 and 413 is removed and their associated pins and bars are withdrawn by spring pressure. If motors 153 have been kept turning, then the released board PCB will be conveyed away from work station 24.

A different type of work station is depicted in FIG. 12 at 524. A printed circuit board PCB is depicted at work station 524 in abutment with a stop pin 511 that has been inserted in the conveyed, longitudinal pathway by a plurality of conveyor wheels 552, only one of which is depicted. Conveyor wheel 552 is comprised of an upper or top flange 556, a central hub 554 of reduced diameter, and a relatively thin, bottom flange 558. A means for rotating wheel 552 is not depicted, but can be comprised of a drive train such as that depicted at 147 in FIG. 4, or a drive belt assembly such as that depicted at 350 in FIGS. 9 and 11. Wheel 552 is rigidly mounted on a vertically aligned axel 559, which in turn, is mounted inside an air cylinder 563. The upper end of axel 559 is rotatably mounted inside air cylinder 563 and forms a piston resiliently held in an upward position by a spring (not shown). Air applied to the top of cylinder 563 forces the piston portion and the entire axel 559 in a downward direction for a predetermined amount of travel, which in turn also forces wheel 552 and the retained circuit board in the downward direction. Cylinder 563 is rigidly mounted to a rail 534 so as to prevent both rotational movement and rectilinear movement.

Also located at work station 524 is a shot pin 507 which is vertically movable to engage an orifice 512 in printed circuit board PCB. Both shot pin 507 and stop pin 511 are mounted below the conveyed board PCB and are vertically movable upward by pneumatic pin assemblies. Stop pin 511 positions board PCB in an approximate position and shot pin 507 accurately positions board PCB when inserted in orifice 512. Shot pin 507 has a rounded upward end to facilitate engagement of orifice 512 and alternatively can be fixedly mounted.

Also located at work station 524 is a conventional circuit board electronic automatic test equipment (not shown). This equipment applies a vacuum to board PCB. A seal around the board is accomplished by a resilient sealing gasket 565. At the same time that a vacuum is applied, air is applied into cylinder 563 thereby forcing wheel 552 and circuit board PCB downwardly. Bottom flange 558 is quite thin, for example, 0.01 inch, and therefore can be forced into contact with gasket 565 and have a seal made around it. Thus, a vacuum seal can be made by the test equipment without releasing circuit board PCB from the conveyor.

Thus, the present invention has been described with respect to a plurality of embodiments thereof. Modifications and combinations of these embodiments would be apparent. For example, a plurality of individually powered conveyor sections can be aligned about the longitudinal axis and various conveyor sections used, for example, as a buffer to extract the boards from a magazine and to store them until needed, a number of working conveyor sections at which different work stations are located, a conveyor section that is mounted for rotation about the longitudinal conveyor axis so that a board can be flipped over, and a final or end buffer station which can store or reinsert the boards into another magazine. Alternatively, the boards after being flipped could be sent in the reverse direction and eventually stored in the same magazine from which it was extracted.

The printed circuit boards which are the preferred conveyed article of the present invention often have standard shapes, dimensions and tolerances. Most printed circuit boards are flat, made from a rigid material that can extend between edge supporting conveyor wheels, and have essentially parallel and essentially straight sides. A conventional printed circuit board size is 5 inches long, by 3.6 inches wide, by 1/16 inch thick. Often, printed circuit boards have a length to width aspect ratio of 1.5 with the board width varying from as small as 3 inches wide to as large as 18 inches wide. Typical tolerances on these dimensions is plus or minus 0.01 inches.

As mentioned above, the present invention permits either a plurality of fixed width conveyors or manually or automatically adjustable width conveyors. While the practical length of each conveyor section is limited, a typical conveyor length being 40 inches, there is no limit to the number of sections that can be linked together. Typical conveyor speed attained without jamming or other conveying problems is at least 10 inches per second, and for some applications can be at least as fast as 20 inches per second.

The individual wheels of the present invention can have either one or two flanges; a double flange wheel being required only in the case of a board flipper or where the upper flange is required to be moved downwardly into a restraining engagement with the conveyed circuit board. Obviously, the wheels of the present conveyor require extremely little board space to effect the conveyance and can drive the boards on either side so that the boards can be flipped, as mentioned above. While the conveyor wheels can be spaced apart a maximum distance so that only two conveyor wheels need to be in engagement with the conveyed board at any one time, it is preferable to have the wheel spacing such that at least three wheels engage the board at any one time. This is usually necessary because of the warping in the boards. As mentioned above, typical wheel diameters are from slightly less than 1 inch to 1.25 inches which permits the wheels to be mounted from 1 inch to 1.5 inches on center. In order to maintain at least three wheels in contact with a conveyed board at all times, this wheel diameter and on center mounting would accommodate a minimum board length of slightly more than 3 inches.

The conveying wheels of the present invention can effectively convey a conventional circuit board with conventional tolerances with a conveying surface width of only 0.075 inches nominally. Practically speaking, the only limit to the maximum width of the conveying surface is the closeness that the board components are placed to the edge of the boards. On the other hand, the limit to the height of the groove between a conveying wheel that has a top and a bottom flange is limited by the thickness of the boards and the thickness tolerance. This places a typical minimum groove height of .100 inches.

As mentioned above, a chamfer can be provided on the bottom wheel flange. The angle of the chamfer can range from 30° to 60°, with a preferred angle being 45°. Under some circumstances, the entire top surface, including the conveying surface of the bottom flange can have an angle with respect to the horizontal conveying plane. As mentioned above, the chamfer is necessary in those cases where the boards or conveyed articles are warped.

Another advantage resulting from the flexibility and simplicity of the present invention is that the entire conveyor section can be transported. For example, instead of magazine 26 moving vertically, conveyor section 22 can be moved vertical relative to a stationary magazine. Also, an entire conveyor section can be moved around by a conventional automatic component insertion machine having an X-Y table, and then reinstalled into the conveyor. The detachable connection assembly 154 depicted in FIG. 4 makes this possible.

In summary, the present invention rapidly, efficiently, and effectively conveys planar articles in reversible rectilinear directions. Because the conveyed articles are not positively engaged or gripped, the present invention has longer maintenance free operation, less board waste, and overall increased productivity. Furthermore, it has been found that no coordination of wheel rotational speed need to done between the two sets of wheels. It has been found that when the rotational speeds are different, the board is conveyed at the slower speed. The lack of a necessity for speed synchronization results in a less expensive conveyor.

Other modifications, applications and advantages of the present invention would be obvious to those of ordinary skill in the art.

I claim:

1. A conveyor for conveying elongate objects having essentially parallel and essentially straight sides that have a substantially flat bottom edqe portion, said conveyor comprising a first set of a plurality of rotatable wheels, each wheel having a conveying surface for supporting only the bottom position of a conveyed object and said wheels being rotatably mounted on individual, rotational axes that are aligned along a first longitudinal axis; and a second set of a plurality of rotatable wheels, each wheel having a conveying surface for supporting only the bottom portion of the conveyed object and said wheels being rotatably mounted on individual, rotational axes that are aligned along a second longitudinal axis that is essentially parallel to and spaced apart from said first longitudinal axis, said conveying surfaces being the only portions of said conveyor in constant supporting, conveying contact with the objects being conveyed.

2. A conveyor as claimed in claim 1 and further comprising a first means for rotating all of said first set of wheels in one rotational direction; and a second means for rotating all of said second set of wheels in the other rotational direction;

and wherein said first and second sets of wheels lie in a substantially horizontal plane.

3. A conveyor as claimed in claim 2 wherein said first rotating means simultaneously rotates all of said first set of wheels at the same rotational velocity and said second rotating means simultaneously rotates all of said second set of wheels at the same rotational velocity.

4. A conveyor as claimed in claim 2 wherein said first and said second rotating means each comprises a gear train that includes a drive gear individual to and rigidly mounted on each wheel and an idler gear in meshing engagement with adjacent drive gears, and motor means for driving said gear train.

5. A conveyor as claimed in claim 2 wherein said first and said second rotating means each comprises a drive gear individual to and rigidly mounted on each wheel, a belt in rotating engagement with said drive gears, and means for rotating at least one drive gear.

6. A conveyor as claimed in claim 5 wherein said first and second rotating means each further comprises an elongate guide bar extending along one side of said belt and closely spaced therefrom; and said drive gears and belt are toothed and in meshing engagement with each other.

7. A conveyor as claimed in claim 1 and further including a magazine for storing a plurality of the objects to be conveyed;

and means for extracting or inserting the objects from or to said magazine and feeding the objects to or from said conveyor wheels.

8. A conveyor as claimed in claim 7 wherein said magazine stores each object in a horizontal plane, and wherein said extracting means comprises opposed, first and second vertically mounted rotatable rollers, means for rotating said rollers, and means for moving said rollers into and out of engagement with the corresponding opposed sides of a stored object.

9. A conveyor as claimed in claim 8 wherein said magazine stores the objects in a vertical stack; and said conveyor further including means for vertically moving said magazine and conveyor relative to each other;

and said conveyor further comprising means for determining when an edge of a board is in said horizontal plane and for generating a signal usable for stopping the vertical movement of said conveyor.

10. A conveyor as claimed in claim 1 wherein each wheel comprises a radially extending flange, said flange having an upper, peripheral surface that extends horizontally and which is said conveying surface.

11. A conveyor as claimed in claim 10 wherein each of said wheels further comprises an axially extending, central hub, wherein each of said wheel axes is substantially vertical, and wherein said conveying surface radially extends from said hub.

12. A conveyor as claimed in claim 10 wherein said flange has a bevelled outer edge, and said conveying surface is located between said outer edge and said hub.

13. A conveyor as claimed in claim 11 wherein said hub extends in an axial direction above said conveying surface and wherein the transverse distance between opposed hubs in said first and second sets of wheels is greater than the width of the object being conveyed in an amount such that said opposed hubs cannot simultaneously contact the object being conveyed.

14. A conveyor as claimed in claim 10 wherein each wheel comprises an upper flange, a lower flange and a slot between said flanges for receiving only a side edge portion of an object being conveyed, said conveying surface being the upper, peripheral portion of said lower flange and said flanges being spaced apart such that there is no conveying engagement of the upper flange with an object being conveyed.

15. A conveyor as claimed in claim 10 wherein said first set of wheels are closely spaced apart and have diameters that are smaller than the width of the object; and wherein said second set of wheels are closely spaced apart and have diameters that are smaller than the width of the object being conveyed.

16. A conveyor as claimed in claim 15 wherein said first set of wheels have diameters that are much smaller than the length of the object being conveyed and the amount of said conveying surface in contact with an object being conveyed is small with respect to the width of the object being conveyed such that minimal rotational torque is applied to the object as it is being conveyed.

17. A conveyor as claimed in claim 15 wherein said first and said second sets of wheels are each comprised of at least three wheels that are spaced apart and have a diameter such that an object to be conveyed can be supportingly engaged along the length thereof by the conveying surfaces of at least three wheels.

18. The conveyor as claimed in claim 1 wherein said wheels of said first set are located transversely opposite corresponding wheels of said second set.

19. The conveyor as claimed in claim 1 and further including a frame having spaced apart first and second rails; and wherein said first set of wheels are mounted to the underside of said first rail; and said second set of wheels are mounted to the underside of said second rail.

20. A conveyor for conveying flat, elongate articles that have essentially parallel and essentially straight sides, such as printed circuit boards, said conveyor comprising a frame that includes spaced apart first and second rails which provide an opening therebetween;

a first set of a plurality of rotatable wheels, each wheel having a horizontal conveying surface for supporting a conveyed article, and said wheels being rotatably mounted to the underside of said first rail on individual, rotational axes that are aligned along a first longitudinal axis, and said wheels being vertically mounted such that all of said conveying surfaces essentially lie in a substantially horizontal plane; and a second set of a plurality of rotatable wheels, each wheel having a horizontal conveying surface for supporting the conveyed article and said wheels being rotatably mounted to the underside of said second rail on individual, rotational axes that are aligned along a second longitudinal axis that is essentially parallel to and spaced apart from said first longitudinal axis and said wheels being vertically mounted such that all of said conveying surfaces essentially lie in said horizontal plane, said wheels of said first and said second sets being spaced apart a distance with respect to the width of the article being conveyed such that the article is only in constant conveying engagement with the corresponding conveying surfaces of said wheels.

21. The conveyor as claimed in claim 20 and further including a work station having a mounting board that extends between said rails, and a stop pin mounted on said mounting board and movable in the vertical direction in said rail spacing between a first position where said pin prevents conveyed movement of an article being convered and a second position where said pin does not interfere with the conveyance of the article.

22. The conveyor as claimed in claim 21 wherein said mounting board is located above said wheels; and
wherein said work station further includes a tool station mounted below said wheels and having a tool that is movable in said rail spacing to engage an article being conveyed.

23. The conveyor as claimed in claim 22 wherein said work station further includes a back up bar mounted on said mounting board in said rail spacing and movable in the vertical direction between a first position where said bar engages the top of an article being conveyed and holds the article against the conveying surface and a second position where said bar is out of engagement with the article.

24. The conveyor as claimed in claim 21 wherein at least one wheel of said first set and at least one wheel of said second set located at said work station are vertically movable between a first conveyed position and a second work position; and
wherein said work station includes vacuum means for applying a vacuum to the bottom of an article being conveyed such that when said wheels are in said work position, the article can be drawn in the downward direction.

25. A conveyor for conveying elongate objects having essentially parallel and essentially straight sides that have a substantially flat bottom edge portion, said conveyor comprising a first set of a plurality of rotatable wheels, each wheel having a conveying surface for supporting only the bottom portion of a conveyed object and said wheels being rotatably mounted on individual, rotational axes that are aligned along a first longitudinal axis; and a second set of a plurality of rotatable wheels, each wheel having a conveying surface for supporting only the bottom portion of the conveyed object and said wheels being rotatablly mounted on individual, rotational axes that are aligned along a second longitudinal axis that is essentially parallel to and spaced apart from said distance and said first longitudinal axis, said conveying surfaces being oriented such that said conveying surfaces are the only portions of said conveyor in constant supporting, conveying contact with the objects being conveyed and no inwardly directed compressive forces are applied to the article being conveyed.

* * * * *